(12) United States Patent
Wilson et al.

(10) Patent No.: US 9,554,482 B2
(45) Date of Patent: Jan. 24, 2017

(54) ENCLOSURE FOR A GENERATOR

(71) Applicant: Caterpillar (NI) Limited, Larne (GB)

(72) Inventors: Michael J. Wilson, Northern Ireland (GB); Colin H. Nugent, Northern Ireland (GB); Gary R. Busby, Northern Ireland (GB); Ivan R. Robinson, Northern Ireland (GB)

(73) Assignee: Caterpillar (NI) Limited, Larne, Northern Ireland ( * ) Notice: Subject to any disclaimer, the term of this patent is extended or adjusted under 35 U.S.C. 154(b) by 0 days.

(21) Appl. No.: 14/416,640

(22) PCT Filed: Oct. 29, 2012

(86) PCT No.: PCT/GB2012/000817
§ 371 (c)(1),
(2) Date: Jan. 23, 2015

(87) PCT Pub. No.: WO2014/016535
PCT Pub. Date: Jan. 30, 2014

(65) Prior Publication Data
US 2015/0181735 A1    Jun. 25, 2015

(30) Foreign Application Priority Data

Jul. 27, 2012 (GB) .................................. 1213399.7

(51) Int. Cl.
*F02B 63/04* (2006.01)
*H02K 7/18* (2006.01)
(Continued)

(52) U.S. Cl.
CPC ............... *H05K 5/03* (2013.01); *F02B 63/044* (2013.01); *H02K 5/10* (2013.01); *H02K 7/1815* (2013.01);
(Continued)

(58) Field of Classification Search
USPC .................................................. 290/1 A, 1 B
See application file for complete search history.

(56) References Cited

U.S. PATENT DOCUMENTS 4,071,009 A * 1/1978 Kraina ................ B60R 13/0838
                                                      123/198 E
4,136,432 A * 1/1979 Melley, Jr. ................ B60P 3/00
                                                      29/469
(Continued)

FOREIGN PATENT DOCUMENTS

EP            2453079        5/2012
JP        2001-317368       11/2001
(Continued)

OTHER PUBLICATIONS

International Search Report dated Mar. 15, 2013.

*Primary Examiner* — Pedro J Cuevas

(57) ABSTRACT

An enclosure is provided which is mountable to a base frame carrying a generator. The enclosure includes a lower portion connectable to the base frame. The lower portion includes a lower first sidewall, a lower second sidewall, and a lower first end wall and a lower second end wall. The enclosure further includes an upper portion having a roof, an upper first sidewall, an upper second sidewall, and an upper end wall depending downwardly from the roof. The lower portion and the upper portion are hingedly connected together such that the upper portion is pivotable relative to the lower portion between closed and open positions.

20 Claims, 5 Drawing Sheets

(51) Int. Cl.
*H05K 5/03* (2006.01)
*H02K 5/10* (2006.01)
*H05K 5/02* (2006.01)

(52) U.S. Cl.
CPC .......... *H05K 5/0213* (2013.01); *H05K 5/0226* (2013.01); *H05K 5/0239* (2013.01); *F02B 2063/045* (2013.01)

(56) References Cited

U.S. PATENT DOCUMENTS

| | | | | |
|---|---|---|---|---|
| 5,624,589 A * | 4/1997 | Latvis | ...................... | B23K 9/32 219/133 |
| 5,642,702 A * | 7/1997 | Kouchi | .................... | F02B 63/04 123/198 E |
| 5,734,148 A * | 3/1998 | Latvis | ...................... | B23K 9/32 219/133 |
| 5,750,278 A * | 5/1998 | Gillett | .................... | H01M 8/247 429/163 |
| 5,785,372 A * | 7/1998 | Glatzmeier | .......... | B62D 33/042 296/24.45 |
| 5,899,174 A * | 5/1999 | Anderson | ............... | F02B 63/04 123/2 |
| 6,051,809 A * | 4/2000 | Colella | ................ | B23K 9/1006 219/133 |
| 6,376,944 B1 * | 4/2002 | Grizzle, Jr. | ............. | F02B 63/04 123/2 |
| 6,447,264 B1 * | 9/2002 | Lucas | ................. | F04B 39/0033 417/201 |
| 6,660,967 B2 * | 12/2003 | Brofft | ..................... | F02B 63/04 219/133 |
| 6,670,580 B2 * | 12/2003 | Brofft | ................... | B23K 9/1006 219/134 |
| 6,756,693 B2 * | 6/2004 | Kennedy | ................. | B60R 16/04 290/1 A |
| 6,962,057 B2 * | 11/2005 | Kurokawa | .............. | F01D 25/24 248/646 |
| 7,049,707 B2 * | 5/2006 | Wurtele | ............. | B60H 1/00378 290/1 A |
| 7,238,916 B2 * | 7/2007 | Samodell | ............... | B23K 9/323 219/125.1 |
| 7,245,033 B2 * | 7/2007 | Wurtele | ............. | B60H 1/00378 123/2 |
| 7,314,397 B2 * | 1/2008 | Sodemann | ............... | F01N 1/083 123/41.7 |
| 7,337,003 B2 * | 2/2008 | Malinowski | ........... | A61N 1/375 607/36 |
| D564,450 S * | 3/2008 | Gravlin | ........................ | D13/122 |
| D567,175 S * | 4/2008 | Knuteson | .................... | D13/112 |
| 7,411,153 B2 * | 8/2008 | Radtke | ..................... | B23K 9/10 16/266 |
| 7,582,978 B2 * | 9/2009 | Flanigan | ................. | F02B 63/04 290/1 A |
| 7,642,665 B2 * | 1/2010 | Konop | ................. | H02K 7/1815 123/2 |
| 7,902,705 B2 * | 3/2011 | Gravlin | .................... | B62B 3/02 290/1 A |
| 8,143,755 B2 * | 3/2012 | Gravlin | .................... | B62B 3/02 290/1 A |
| D711,825 S * | 8/2014 | Wilson | ......................... | D13/112 |
| 8,872,361 B2 * | 10/2014 | Janscha | ................. | F02B 63/04 290/1 A |
| 8,890,340 B2 * | 11/2014 | Honkanen | ............. | F02B 63/044 123/2 |
| 8,960,708 B2 * | 2/2015 | Ziebert | ................. | F02B 63/044 123/2 |
| 8,963,348 B2 * | 2/2015 | Kawakita | .............. | F02B 63/044 123/2 |
| 9,181,865 B2 * | 11/2015 | Richardson | ............. | F02B 63/04 |
| 9,212,604 B2 * | 12/2015 | Danforth, III | .......... | F02B 63/04 |
| 2006/0065216 A1 * | 3/2006 | Sugimoto | ................ | F01P 5/06 123/41.7 |
| 2006/0167534 A1 * | 7/2006 | Malinowski | ........... | A61N 1/375 607/115 |
| 2008/0042625 A1 * | 2/2008 | Konop | ................. | H02K 7/1815 322/1 |
| 2008/0185801 A1 * | 8/2008 | Gravlin | ..................... | B62B 3/02 280/47.11 |
| 2009/0066091 A1 * | 3/2009 | Hunter | .............. | H01M 8/04201 290/1 A |
| 2010/0037837 A1 * | 2/2010 | Yamasaki | ................. | F01P 1/06 123/41.6 |
| 2011/0115235 A1 * | 5/2011 | Steffl | ......................... | H02P 9/04 290/1 B |
| 2011/0148228 A1 * | 6/2011 | Gravlin | ..................... | B62B 3/02 310/51 |
| 2014/0306425 A1 * | 10/2014 | Atkinson | ............. | B62D 33/023 280/414.5 |
| 2015/0183168 A1 * | 7/2015 | Liverman | ........... | B29C 67/0088 264/401 |

FOREIGN PATENT DOCUMENTS

JP     2010-133430     6/2010
WO    WO 2014/016535  1/2014

* cited by examiner

ENCLOSURE FOR A GENERATOR

CLAIM FOR PRIORITY

This application is a U.S. National Phase entry under 35 U.S.C. §371 from PCT International Application No. PCT/GB2012/000817, filed Oct. 29, 2012, which claims benefit of priority of United Kingdom Patent Application No. 1213399.7, filed Jul. 27, 2012, all of which are incorporated herein by reference.

TECHNICAL FIELD

The present disclosure relates to an enclosure for a generator, and more particularly to an enclosure configured to improve access to its interior.

BACKGROUND

Generally electrical generator sets comprise a prime mover (usually a gasoline-powered internal combustion engine), fuel tank, an alternator, controls and other electronics all supported on a base frame. Such configurations are usually not well suited for placement in exposed unprotected outdoor locations, because prolonged exposure to the environment and the exhaust gas from the generator itself may result in damage to the generator set and its components, and degrade the operation of the generator. Furthermore, the noise emitted from the generator is considerable and thus should be attenuated, particularly when the generator set is intended to be used in built-up areas.

In an effort to safeguard the generator and attenuate the noise, some generator set manufacturers provide a purpose-designed enclosure for the generator. The enclosure may help to protect the generator against direct exposure to outside conditions, such as rain and other increment conditions. Thus, the enclosure enables the generator set to be placed in almost any environmental conditions, at desired locations. Typically, the generator enclosures available in the market are made of some metallic compounds, such as steel. Further, such enclosures may need to be removed from the base frame to enable the generator housed inside, to be accessed, for example, for repair and maintenance works.

SUMMARY

The present disclosure provides an enclosure mountable to a base frame carrying a generator. The enclosure includes a lower portion connectable to the base frame. The lower portion includes a lower first sidewall, a lower second sidewall, and a lower first end wall and a lower second end wall. The enclosure further includes an upper portion having a roof, an upper first sidewall, an upper second sidewall, and an upper end wall depending downwardly from the roof. The lower portion and the upper portion are hingedly connected together such that the upper portion is pivotable relative to the lower portion between closed and open positions.

Other features and aspects of this disclosure will be apparent from the following description and the accompanying drawings.

DETAILED DESCRIPTION

Figure 1:
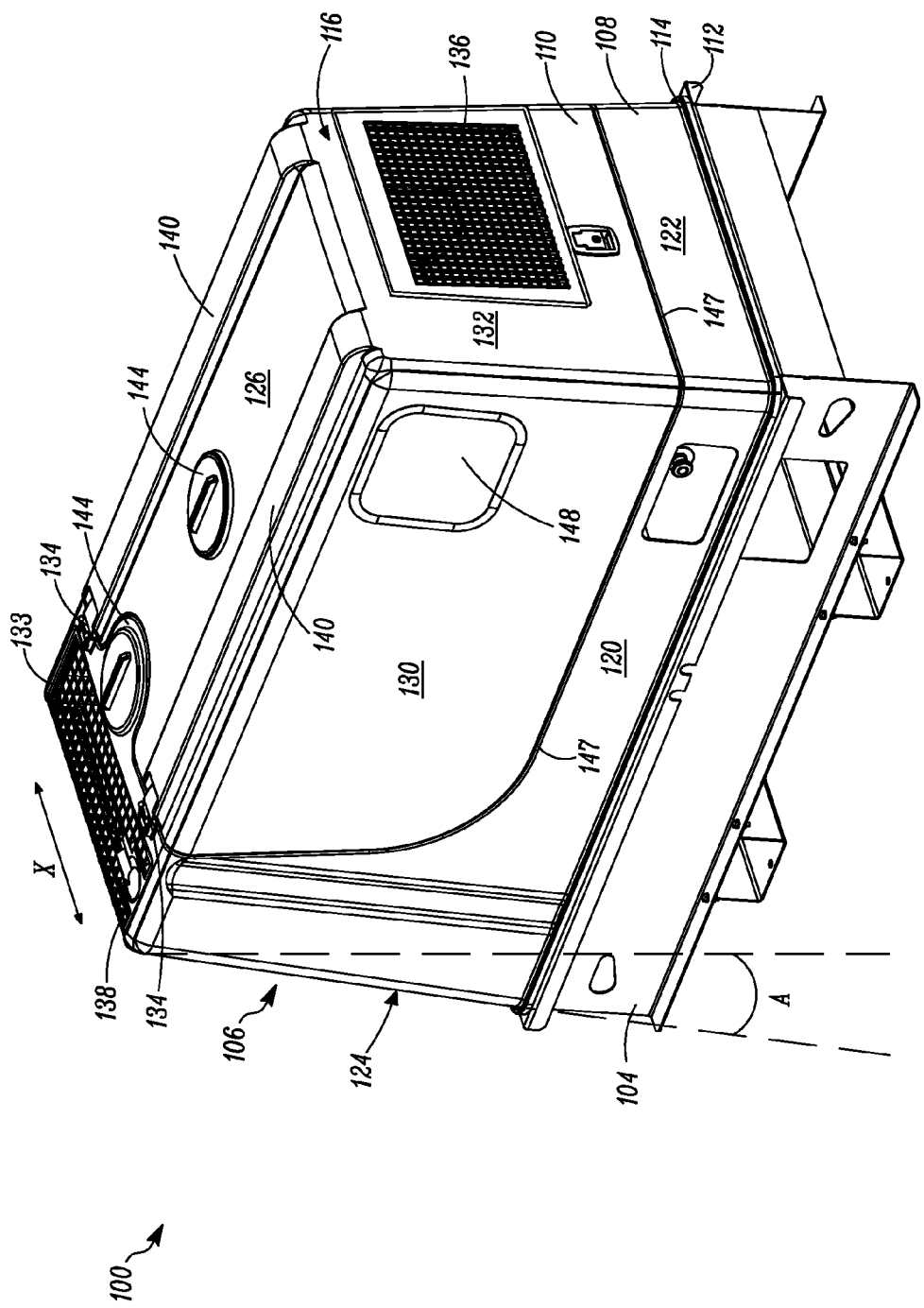
FIG. 1 illustrates a perspective representation of an exemplary disclosed generator set with an enclosure shown in a closed position.
Figure 2:
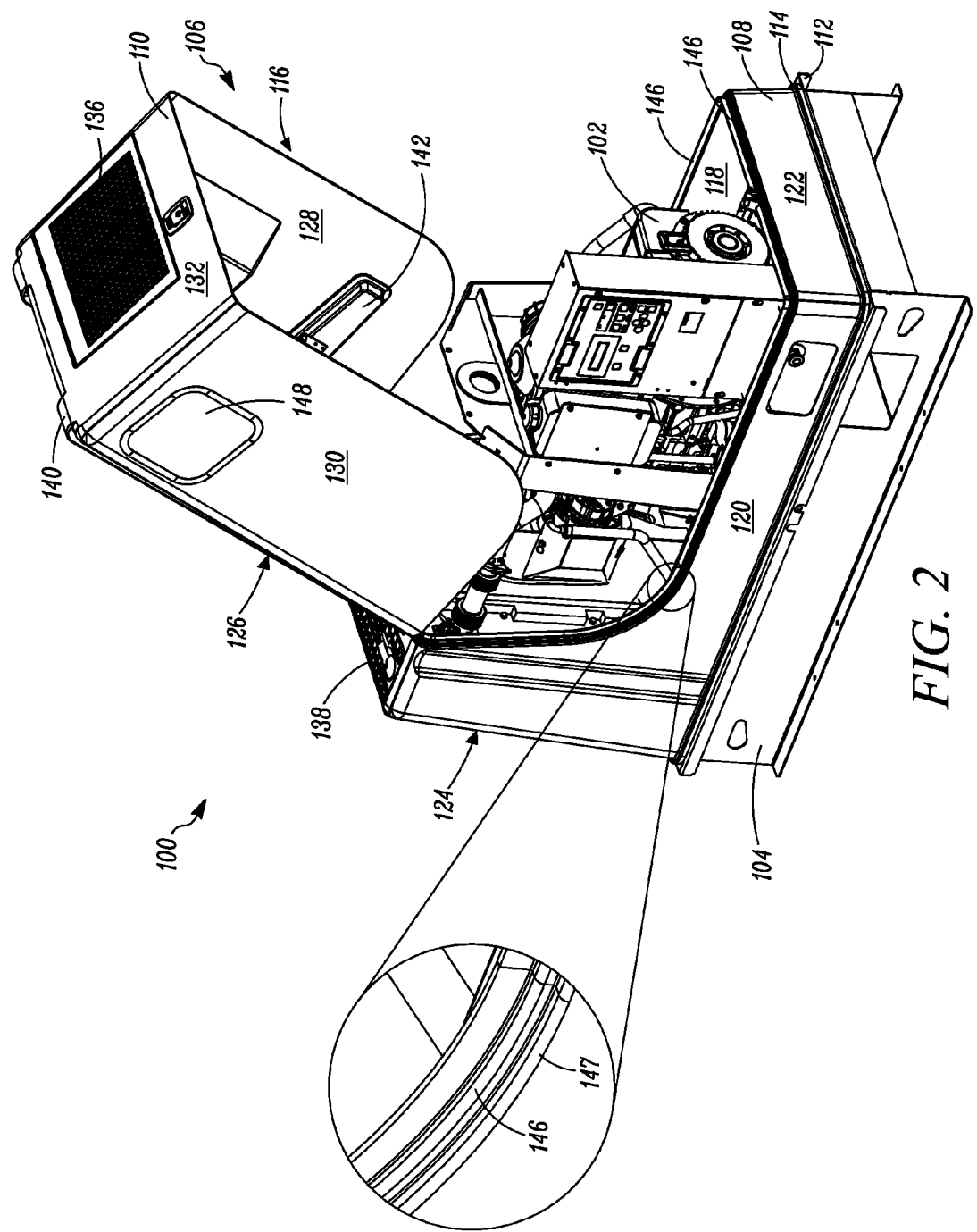
FIG. 2 illustrates the generator set of FIG. 1 with the enclosure shown in an opened position.
Figure 4:
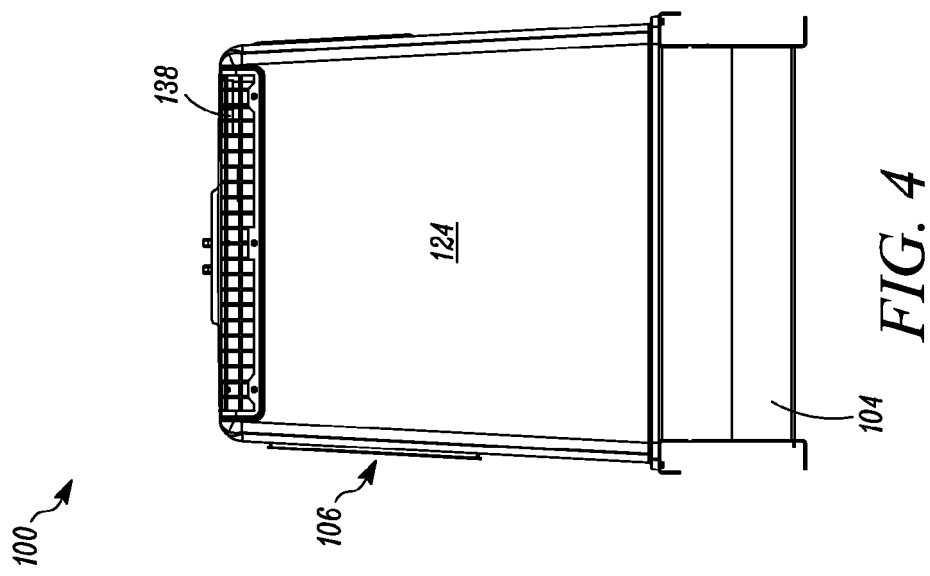
FIG. 4 illustrates an end view of the generator set.

The present disclosure will now be described in detail with reference being made to the accompanying figures. FIGS. 1 and 2 show an exemplary embodiment of a generator set 100 in closed and opened positions, respectively. The generator set 100 primarily includes a generator 102, as illustrated in FIG. 2. The term "generator" may refer to electric machines, motors, induction devices, or the like. The generator 102 may include a conventional dynamoelectric alternator driven by any suitable motive source, such as a spark-ignited or compression-ignited reciprocating piston engine or a diesel or natural gas powered turbine engine. Alternatively, the generator 102 may use an alternator having a rotating armature or rotor and a fixed stator, hydrogen or other fuel cell, a solar power cell, or any other device for producing electrical power.

The generator set 100 may include a base frame 104 to support the generator 102. The generator 102 may be mounted on the base frame 104 in a conventional manner except as specifically described herein. The base frame 104 may be shaped such as to conform to the shape of the bottom portion of the generator 102, in order to facilitate installation. The base frame 104 may include numerous struts (not illustrated) to provide better weight distribution of the generator 102 mounted thereon. Further, the base frame 104 may include guides disposed at the underside. The guides may help to engage the base frame 104 with some corresponding means provided on a vehicle configured to facilitate transportation of the generator set 100.

The present disclosure provides an enclosure 106 for the generator 102, in the generator set 100. The enclosure 106 may be adaptable to be mounted on the base frame 104, on which the generator 102 may also be mounted. The enclosure 106 described herein may provide ease of installation and maintenance, facilitate cooling of the generator 102 housed inside, provide improved sound attenuation, and some other advantages as would be evident from the following description. It may be understood by a person ordinarily skilled in the art that the dimensions and shape of the enclosure 106 may be varied as necessary suitably to contain generators of varying sizes. In an embodiment, as illustrated in FIG. 1, the enclosure 106 may have an overall shape and dimension resembling a curved or oblong rectangular-like structure.

In an embodiment of the present disclosure, the enclosure 106 may be made of a thermoset polymer. For example, the enclosure 106 may be made of Dicyclopentadiene (DCPD) which is known to have high corrosion resistance, high heat resistance, high impact resistance, high stiffness, high chemical resistance, high rigidity, high adhesion, to name some of its properties. Further, this material has the properties of being easily moldable and paintable which helps to impart structural and aesthetic characteristics to the enclosure 106. In other embodiments, the enclosure 106 may be made of some other thermoset polymer, such as, Glass Reinforced Plastic (GRP) or the like.

The enclosure 106 of the present disclosure includes a lower portion 108 and an upper portion 110. It may be understood that the lower portion 108 and the upper portion 110 together form the enclosure 106. The lower portion 108 and the upper portion 110 may, individually, be casted as a monolithic structure. Alternatively, the lower portion 108 and the upper portion 110, respectively, may be formed of a plurality of panels connected together by some means known in the art, such as, fasteners, welding, rivets, and so on.

The enclosure 106 may be configured to be fixedly connected to the base frame 104, in the generator set 100. For this purpose, the lower portion 108 may have flanges 112 extending outwardly from the bottom. Also, the base frame 104 may have corresponding flanges 114 extending outwardly from the top. The lower portion 108 may be connected to the base frame 104 by using some fastening means, such as, but not limited to, nuts and bolts, passing through the flanges 112, 114. This will help to properly mount and connect the enclosure 106 to the base frame 104. Additionally, the flanges 112, 114 may provide extra stiffness to the enclosure 106.

Moving on, FIGS. 3-7 illustrate different side views of the generator set 100. As illustrated, the lower portion 108 may include a spaced lower first sidewall 118 and lower second sidewall 120. The lower portion 108 may also include a lower first end wall 122 and a lower second end wall 124 located opposite to each other, and rigidly connected with the lower first and second sidewalls 118, 120 to form a monolithic structure. Further, the upper portion 110 may include a roof 126, and a spaced upper first sidewall 128 and upper second sidewall 130, and an upper end wall 132 depending downwardly from the roof 126. As illustrated in FIG. 1, the lower portion 108 may also include a roof section 133 disposed between the lower first and second sidewalls 118, 120, and the lower second end wall 124. The roof section 133 may be partially extending in a direction along a longer side of the enclosure 106, parallel to the lower first and second sidewalls 118, 120. From hereinafter, the walls 118, 120, 122, 124, 128, 130 are collectively referred to as walls 116.

In an embodiment, the walls 116 of the enclosure 106 may be angled having a slope extending outwardly from the top towards the bottom of the enclosure 106. In an exemplary configuration, an angle A, with which the sidewalls extend outwardly, may lie in the range of approximately 2-10 degrees. Further, the roof 126 may have a curvilinear profile, so to be sloped downwardly from the center towards the edges, imparting a slightly circular profile to the enclosure 106.

Figure 7:
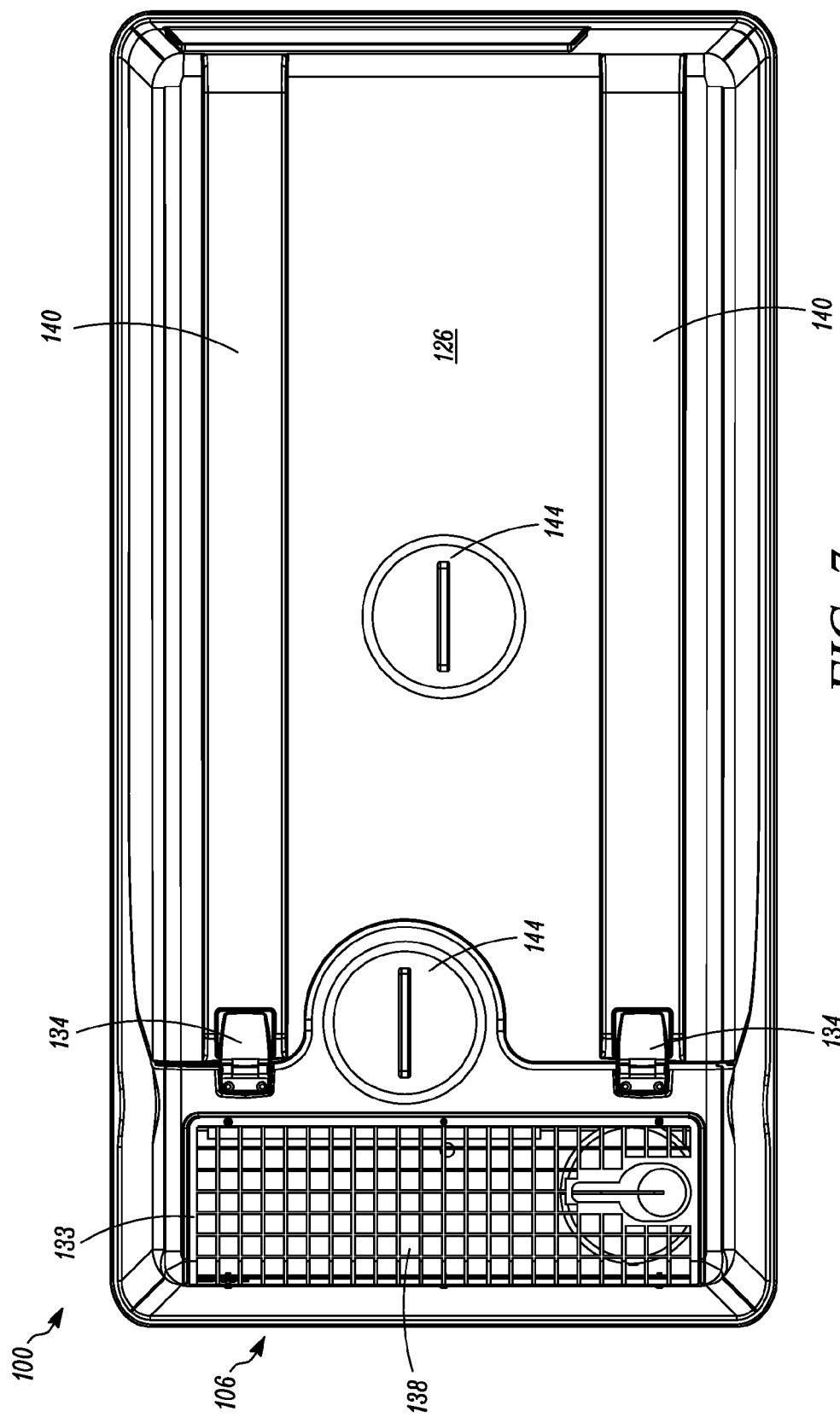
FIG. 7 illustrates a top view of the generator set.

In an embodiment, the lower portion 108 and the upper portion 110 are hingedly connected to each other. For example, as illustrated in FIGS. 1 and 7, the lower portion 108 and the upper portion 110 may be connected by using hinges 134 disposed along an axis X in a direction parallel to an end wall of the enclosure 106. In this exemplary configuration, the upper portion 110 is rotatable about an axis disposed towards the end wall 124 the enclosure 106. This way, the upper portion 110 may be rotatable to move between the open and the closed positions. When the upper portion 110 is elevated to the open position, as illustrated in FIG. 2, the generator 102 may be exposed and accessed for servicing and/or maintenance work, if required.

The lower portion 108 and the upper portion 110 may include one or more vents provided in one or more walls 116 of the enclosure 106, as illustrated in the associated drawings. For example, the enclosure 106 may include air inlet vents 136 for introduction of cooling air for the generator 102, and air outlet vents 138 to allow for the hot air, from the generator 102, to discharge away from inside of the enclosure 106. As may be seen that the vents 136, 138 may be a combination of a panel and a wire mesh arranged with in. The vents 136, 138 may conform to the contour/slope of the walls 116 of the enclosure 106 in order to facilitate removing and providing improved airflow. Further, the vents 136, 138 of the present disclosure may be removable to aid in cleaning and maintenance works.

Figure 3:
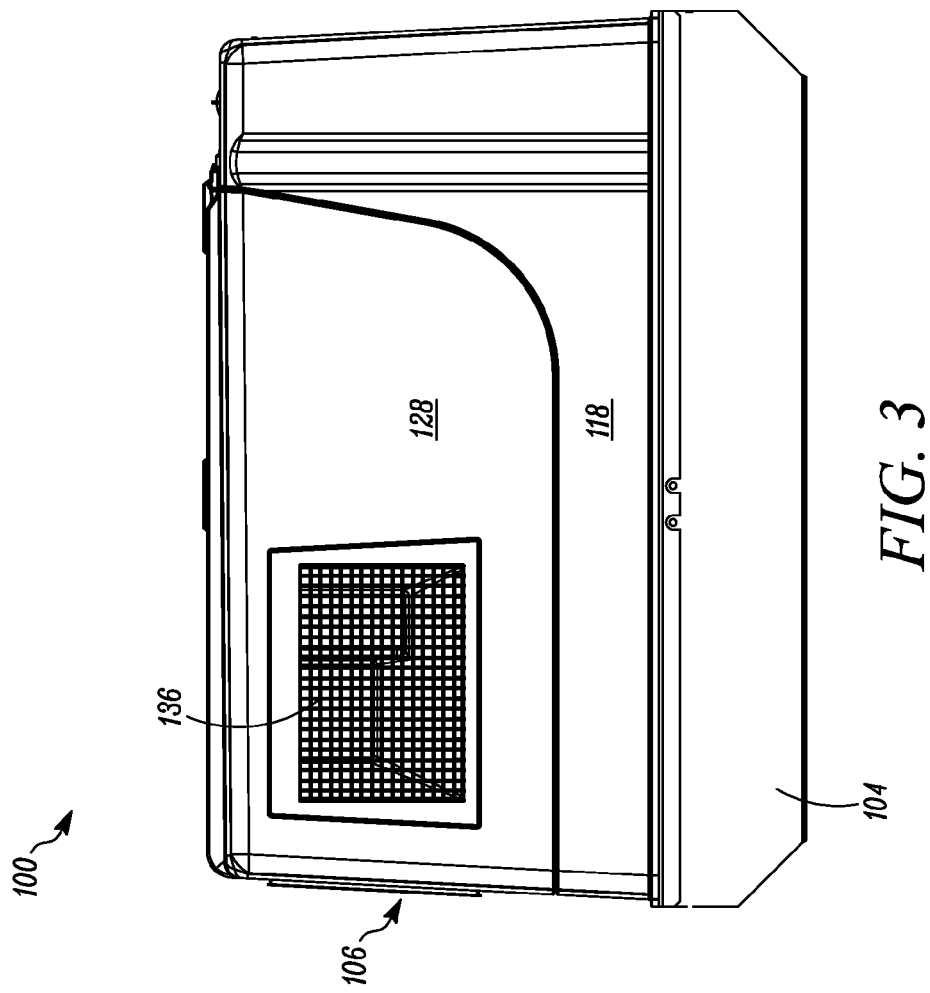
FIG. 3 illustrates a side view of the generator set.
Figure 6:
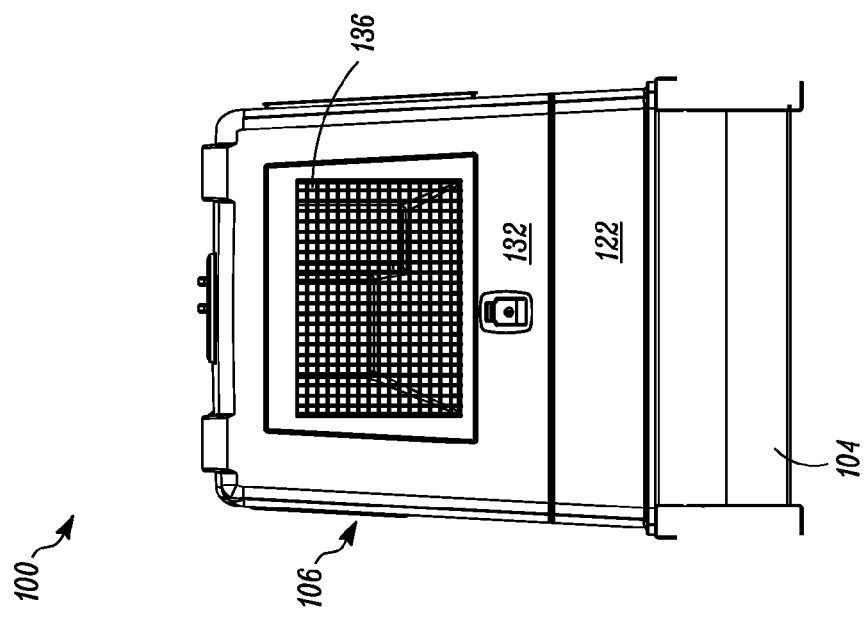
FIG. 6 illustrates an end view of the generator set.
Figure 5:
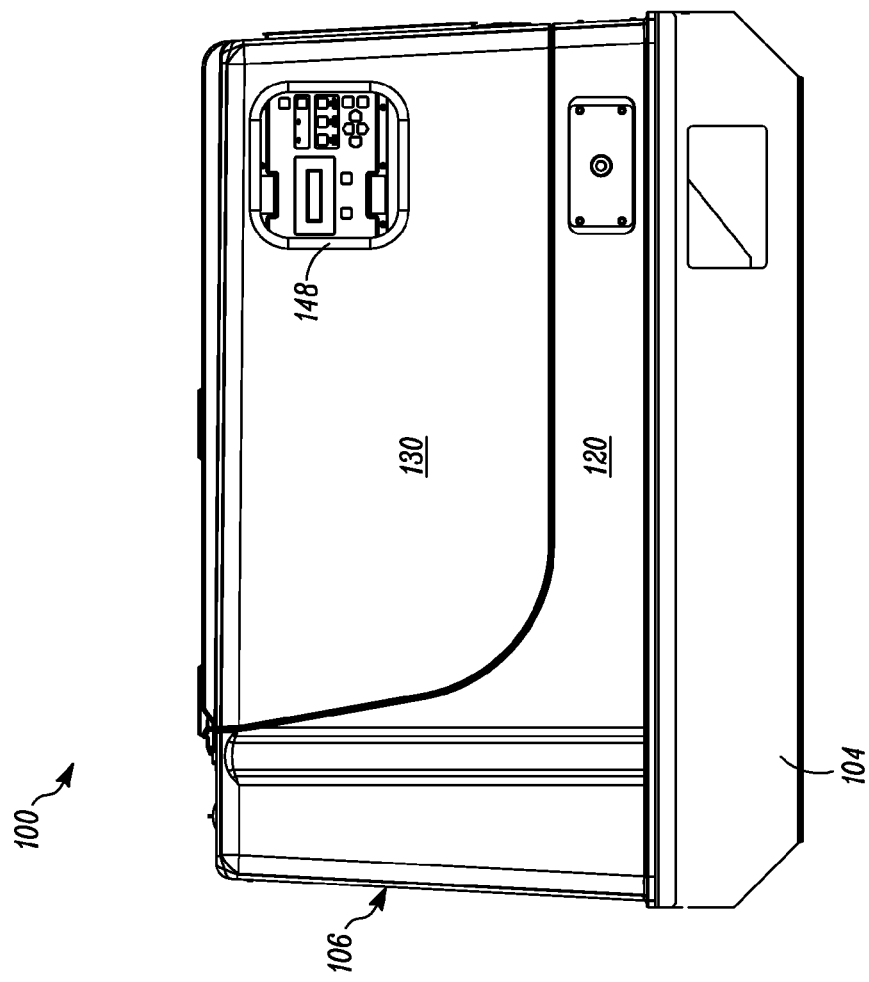
FIG. 5 illustrates a side view of the generator set.

In an exemplary configuration, as clearly illustrated in FIGS. 3 and 6, the enclosure 106 includes a pair of air inlet vents 136 disposed in the upper first sidewall 128 and the upper end wall 132, of the upper portion 110. Further, as illustrated in FIG. 7, the air outlet vent 138 is provided in the roof section 133 of the enclosure 106. The air outlet vent 138 may extend to some extent along the lower second end wall 124, as more clearly illustrated in FIG. 4.

The enclosure 106 may further include a plurality of ribs formed therein. The ribs may, generally, be disposed to provide additional strength/stiffness to the enclosure 106. In an embodiment, as illustrated in FIG. 1, the enclosure 106 may include one or more external ribs 140 upstanding from the roof 126 of the enclosure 106. Further, the enclosure 106 may include one or more internal ribs 142 extending from the inner surface of the enclosure 106, as illustrated in FIG. 2. However, it may be contemplated that a greater or lesser number of the ribs 140, 142 may be provided over other areas of the enclosure 106, depending upon the design requirement of the enclosure 106.

Further, as illustrated in FIGS. 2 and 6, the enclosure 106 may also include one or more roof hatches 144 provided in the roof 126. In the illustrated embodiment, the enclosure 106 has been shown with two roof hatches 144. The roof hatches 144 may provide access to the inside of the enclosure 106 from the top. The roof hatches 144 may have a raised profile at the periphery in order to prevent water penetration.

The enclosure 106 may also include a drain 146. The drain 146 may be in the form of a channel defined along one or more lateral edges 147 of the lower portion 108, where the lower portion 108 and the upper portion 110 abut in the closed position of the enclosure 106. The drain 146 may include steps sloping from the interior towards the exterior of the enclosure 106, so as to direct any water, flowing over the enclosure 106 to enter its interior.

The enclosure 106 may also include an access window 148 disposed in relation to a control panel of the generator 102. The access window 148 may be a transparent window, such as a glass window, in order to allow the operator to see the readings in the control panel. Further, the access window 148 may be opened to change/adjust any settings, by accessing the controls in the control panel.

In other embodiments, the enclosure 106 may further include components and means to facilitate the operation of the generator 102. For example, the enclosure 106 may include a lock (not shown) to limit the movement of the enclosure 106 between the closed and the open positions. Further, the enclosure 106 may include means to hold the upper portion 110, in the open position of the enclosure 106. The enclosure 106 may also include a handle for the operator to lift the upper portion 110 for the opened position of the enclosure 106.

INDUSTRIAL APPLICABILITY

The industrial applicability of the apparatus described herein will be readily appreciated from the foregoing discussion. The enclosure 106 of the present disclosure is movable between the closed and the open positions. Specifically, the upper portion 110 may be rotated about the lower potion 108 between the closed and the open positions. When the upper portion 110 is rotated towards the open position, the generator 102 may be exposed and accessed for servicing and/or maintenance work, if required. Further, the roof hatches 144 and the access window 148 may allow for access to specific regions in the generator 102.

The angled walls 116 of the present disclosure may also add to the rigidity of the enclosure 106. Further, the ribs 140, 142 may add to the rigidity and the robustness of the enclosure 106. The enclosure 106 of the present disclosure being made of thermoset polymer, such as Dicyclopentadiene (DCPD) which may provide improved robustness, in addition to being easily moldable, and non-corrosive. The use of thermoset polymer facilitates easy forming and assembly of the enclosure 106, still keeping the enclosure 106 light-weighted.

Further, the enclosure 106 of the present disclosure with the angled walls 116 may allow for the water, such as rain water, collected over the top to easily flow downwards and away from the enclosure 106. The curvilinear and the sloped profile of the roof 126 may aid to direct water collected over the enclosure 106 towards the walls 116. Also, the drain 146 may help to guide the water from the top towards the bottom along the lateral edge 147, and towards the outer side of the enclosure 106 because of the steps sloping outwardly. The raised periphery of the roof hatch 144 helps to prevent water to enter into the interior of the enclosure 106.

Although the embodiments of this disclosure as described herein may be incorporated without departing from the scope of the following claims, it will be apparent to a person skilled in the art that various modifications and variations to the above disclosure may be made. Other embodiments will be apparent to those skilled in the art from consideration of the specification and practice of the disclosure. It is intended that the specification and examples be considered as exemplary only, with a true scope being indicated by the following claims and their equivalents.

The invention claimed is:

1. An enclosure mountable to a base frame carrying a generator, the enclosure comprising:
   a lower portion connectable to the base frame, the lower portion having a lower first sidewall, a lower second sidewall, a lower first end wall, a lower second end wall, and a roof section disposed between the lower first and second sidewalls and the lower second end wall;
   an upper portion having a roof, an upper first sidewall, an upper second sidewall and an upper end wall depending downwardly from the roof; and
   wherein the roof section of the lower portion and the roof of the upper portion are hingedly connected together, such that the upper portion is pivotable relative to the lower portion between closed and open positions, and wherein the roof section of the lower portion is aligned with the roof of the upper portion when the upper portion is in the closed position.

2. The enclosure of claim 1, wherein the enclosure is made of a composite material.

3. The enclosure of claim 1, wherein the enclosure is made of a thermoset polymer.

4. The enclosure of claim 1, wherein the enclosure is made of Dicyclopentadiene (DCPD).

5. The enclosure of claim 1, wherein the lower portion includes flanges extending outwardly and is connectable to the base frame by fastening means associated with the flanges.

6. The enclosure of claim 1, wherein at least one or more walls flare outwardly, away from the roof.

7. The enclosure of claim 6, wherein the angle between the walls and an orthogonal axis to the roof is in the range of 2-10 degrees.

8. The enclosure of claim 1 further including one or more vents disposed in at least one of the upper portion and the lower portion.

9. The enclosure of claim 1 further including one or more vents disposed in one or more of the upper first sidewall, the upper second sidewall and the upper end wall of the upper portion.

10. The enclosure of claim 1 further including ribs formed in one or more of the lower portion and the upper portion.

11. The enclosure of claim 1 further including one or more access hatches provided in the roof of the upper portion.

12. The enclosure of claim 1 further including a drain formed along lateral edges of the first and second side walls of the lower portion.

13. The enclosure of claim 1, wherein the lower first and second side walls are configured for mating with respective upper first and second side walls of the upper portion.

14. The enclosure of claim 13, wherein the upper first and second side walls each have an arcuate corner remote from the upper end wall and the lower first and second side walls of the lower portion are shaped with a curvilinear profile along upper edges configured to mate with the arcuate corner of the upper first and second sidewalls, respectively.

15. A generator set, comprising:
   an engine;
   an alternator driven by the engine;
   a base frame configured to support the engine and the alternator; and
   an enclosure mountable to the base frame, the enclosure comprising:
      a lower portion connectable to the base frame, the lower portion having a lower first sidewall, a lower second sidewall, a lower first end wall, a lower second end wall, and a roof section disposed between the lower first and second sidewalls and the lower second end wall;
      an upper portion having a roof, an upper first sidewall, an upper second sidewall and an upper end wall depending downwardly from the roof; and
      wherein the roof section of the lower portion and the roof of the upper portion are hingedly connected together, such that the upper portion is pivotable relative to the lower portion between closed and open positions, and wherein the roof section of the lower portion is aligned with the roof of the upper portion when the upper portion is in the closed position.

16. The generator set of claim 15, wherein the lower portion of the enclosure includes flanges extending outwardly and is connectable to the base frame by fastening means associated with the flanges.

17. The generator set of claim 15, wherein at least one or more walls of the enclosure flare outwardly, away from the roof of the upper portion of the enclosure.

18. The generator set of claim 15 further including one or more vents disposed in at least one of the upper portion and the lower portion.

19. The generator set of claim 15 further including ribs formed in one or more of the lower portion and the upper portion.

20. An enclosure mountable to a base frame carrying a generator set, the enclosure comprising:
- a lower portion connectable to the base frame, the lower portion having a lower first sidewall, a lower second sidewall, a lower first end wall, a lower second end wall, and a roof section disposed between the lower first and second sidewalls and the lower second end wall, and the lower portion including flanges extending outwardly from a bottom of the lower portion such that the lower portion is connectable to the base frame by fastening means associated with the flanges;
- an upper portion having a roof, an upper first sidewall, an upper second sidewall and an upper end wall depending downwardly from the roof;
- one or more vents disposed in at least one of the upper portion and the lower portion;
- ribs formed in one or more of the lower portion and the upper portion;
- one or more access hatches provided in the roof of the upper portion; and
- wherein the roof section of the lower portion and the roof of the upper portion are hingedly connected together, such that the upper portion is pivotable relative to the lower portion between closed and open positions, and wherein the roof section of the lower portion is aligned with the roof of the upper portion when the upper portion is in the closed position.

* * * * *

UNITED STATES PATENT AND TRADEMARK OFFICE
CERTIFICATE OF CORRECTION

PATENT NO.         : 9,554,482 B2                                  Page 1 of 1
APPLICATION NO.    : 14/416640
DATED              : January 24, 2017
INVENTOR(S)        : Wilson et al.

It is certified that error appears in the above-identified patent and that said Letters Patent is hereby corrected as shown below:

On the Title Page

Column 1, Item (73) (Assignee), Line 2, delete "Northan Ireland" and insert
-- Northan Ireland (UK) --.

Signed and Sealed this
Second Day of May, 2017

Michelle K. Lee
*Director of the United States Patent and Trademark Office*